(12) United States Patent
Chen et al.

(10) Patent No.: US 7,250,339 B2
(45) Date of Patent: *Jul. 31, 2007

(54) ELECTRICALLY ERASABLE PROGRAMMABLE READ-ONLY MEMORY CELL AND MEMORY DEVICE AND MANUFACTURING METHOD THEREOF

(75) Inventors: Jung-Ching Chen, Dadu Township, Taichung County (TW); Spring Chen, Hsinchu (TW); Chuang-Hsin Chueh, Sijhih (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154 (a)(2).

Subject to any disclaimer, the term of this patent is extended or adjusted under 35 U.S.C. 154(b) by 0 days.

(21) Appl. No.: 11/671,971

(22) Filed: Feb. 6, 2007

(65) Prior Publication Data

US 2007/0128801 A1    Jun. 7, 2007

Related U.S. Application Data

(62) Division of application No. 10/980,075, filed on Nov. 2, 2004.

(51) Int. Cl.
*H01L 21/8247* (2006.01)

(52) U.S. Cl. ............... 438/258; 257/318; 257/E21.179
(58) Field of Classification Search ........ 438/257–267; 257/318, E21.179
See application file for complete search history.

(56) References Cited

U.S. PATENT DOCUMENTS

| | | | | |
|---|---|---|---|---|
| 5,960,274 A | * | 9/1999 | Mehta | 438/211 |
| 6,489,202 B1 | * | 12/2002 | Hsu et al. | 438/258 |
| 6,900,097 B2 | * | 5/2005 | Chen et al. | 438/257 |

* cited by examiner

*Primary Examiner*—Richard A. Booth
(74) *Attorney, Agent, or Firm*—J.C. Patents

(57) ABSTRACT

A manufacturing method and a device of an EEPROM cell are provided. The method includes the following steps. First, a tunnel layer and an inter-gate dielectric layer are formed over a surface of a substrate respectively, and a doped region is formed in the substrate under the inter-gate dielectric layer and used as a control gate. Thereafter, a floating gate is formed over the inter-gate dielectric layer and the tunnel layer. Thereafter, a source region and a drain region are formed in the substrate beside two sides of the floating gate under the tunnel layer. Especially, the manufacturing method of the memory cell can be integrated with the manufacturing process of high operation voltage component and low operation voltage component.

7 Claims, 6 Drawing Sheets

ELECTRICALLY ERASABLE PROGRAMMABLE READ-ONLY MEMORY CELL AND MEMORY DEVICE AND MANUFACTURING METHOD THEREOF

CROSS-REFERENCE TO RELATED APPLICATION

This application is a divisional application of, and claims the priority benefit of, U.S. application Ser. No. 10/980,075 filed on Nov. 2, 2004.

BACKGROUND OF THE INVENTION

1. Field of the Invention

The present invention relates to a memory device and a manufacturing method thereof. More particularly, the present invention relates to an electrically erasable programmable read-only memory (EEPROM) cell and memory device that can be compatible with high operational voltage component and low operational voltage component, and the manufacturing method thereof.

2. Description of Related Art

Conventionally, electrically erasable programmable read-only memory (EEPROM) has the advantages of being programmable, erasable and the stored data being retainable even the power to the device is removed. In addition, EEPROM is also a kind of non-volatile memory. Therefore, EEPROM is very suitable for being integrated in a logic or mixed mode integrated circuits (IC) to enhance the auto-recovery or auto-adjustment function of the logic or mixed mode IC.

FIG. 1A and FIG. 1B are schematic cross-sectional views illustrating a manufacturing process of a conventional EEPROM. Referring to FIG. 1A, in the manufacturing process of a conventional EEPROM, a tunnel layer 102, a polysilicon floating gate layer 104, an inter-gate dielectric layer 106 and a polysilicon control gate layer 108 are formed on a substrate 100 sequentially. Then, referring to FIG. 1B, the layers described above are patterned to form a stacked gate structure 110, and a source region 112a and a drain region 112b are formed in the substrate 100 beside two sides of the stacked gate structure 110.

However, in the manufacturing process described above, at least two polysilicon layers shall be disposed to form the floating gate and the control gate respectively. In addition, the two polysilicon layers of the memory cell and the gate of the metal oxide semiconductor (MOS) component of the peripheral circuit area are not at the same level of height. Therefore, the integration of the memory cell with the peripheral circuit is difficult.

In addition, the operation voltage of a conventional EEPROM is generally less than 12V. Therefore, the integration of EEPROM with high operational voltage component and low operational voltage component is difficult.

Furthermore, a conventional EEPROM cell is generally formed in an isolated well region; thus the EEPROM cell may be operated independently. Accordingly, the EEPROM cell can not share the same well region with the high operational voltage component and the low operational voltage component. Therefore, it is difficult to integrate an EEPROM cell with high operational voltage component and low operational voltage component.

SUMMARY OF THE INVENTION

Therefore, the present invention is directed to a manufacturing method of an EEPROM cell that can be easily integrated with the manufacturing process of the component of the peripheral circuit because the gate height of the EEPROM cell is similar to that of the peripheral circuit.

In addition, the present invention is directed to an EEPROM cell having a novel structure being different from the conventional memory structure constructed by two polysilicon layers.

Moreover, the present invention is directed to a manufacturing method of a memory device for solving the problem that the process of the conventional EEPROM cell can not be integrated with the process of the high operational voltage component and the low operational voltage component.

Furthermore, the present invention is directed to a memory device for solving the problem that the conventional EEPROM cell can not be incorporated with the high operational voltage component and the low operational voltage component.

According to one embodiment of the present invention, a manufacturing method of an EEPROM cell is provided. The method comprises, for example but not limited to, the following steps. First, a tunnel layer and an inter-gate dielectric layer are formed over a surface of a substrate respectively. Then, a doped region is formed in the substrate under the inter-gate dielectric layer and used as a control gate. Thereafter, a floating gate is formed over the inter-gate dielectric layer and the tunnel layer. A source region and a drain region are further formed in the substrate beside two sides of the floating gate under the tunnel layer.

According to one embodiment of the present invention, an EEPROM cell is provided. The EEPROM cell comprises a substrate, an inter-gate dielectric layer, a tunnel layer, a doped region, a floating gate, a source region and a drain region. The inter-gate dielectric layer and the tunnel layer are disposed over a surface of the substrate respectively. In addition, the doped region is disposed in the substrate under the inter-gate dielectric layer, and is used as a control gate. Moreover, the floating gate is disposed over the tunnel layer and the inter-gate dielectric layer. In addition, the source region and the drain region are disposed in the substrate at two sides of the floating gate under the tunnel layer.

Moreover, according to one embodiment of the present invention, a manufacturing method of a memory device is provided. The method comprises, for example but not limited to, the following steps. First, a substrate comprising a memory cell area and a peripheral circuit area is provided. The peripheral circuit area comprises a high operational voltage component area and a low operational voltage component area. Thereafter, a tunnel layer and an inter-gate dielectric layer are formed over a surface of the substrate of the memory cell area respectively. Then, a first inter-gate dielectric layer and a second inter-gate dielectric layer are formed over a surface of the substrate of the high operational voltage component area and the low operational voltage component area of the peripheral circuit area respectively. A doped region is formed in the substrate under the inter-gate dielectric layer and used as a control gate. Then, a floating gate is formed over the inter-gate dielectric layer and the tunnel layer in the memory cell area, and a first gate and a second gate are formed over the first inter-gate dielectric layer and the second inter-gate dielectric layer in the peripheral circuit area respectively. Thereafter, a first source region and a first drain region are formed in the substrate beside two sides of the floating gate under the tunnel layer of the memory cell area. In the peripheral circuit area, a second source region and a second drain region are formed in the substrate beside two sides of the first gate, and a third source region and a third drain region are formed in the substrate beside two sides of the second gate.

In addition, according to one embodiment of the present invention, a memory device is provided. The memory device comprises, for example but not limited to, a substrate, at least a memory cell, at least a high operational voltage component and at least a low operational voltage component. The substrate comprises a memory cell area and a peripheral circuit area. The peripheral circuit area comprises a high operational voltage component area and a low operational voltage component area. In addition, the memory cell is disposed in the memory cell area, and comprises an inter-gate dielectric layer, a tunnel layer, a doped region, a floating gate, a first source region and a first drain region. The inter-gate dielectric layer and the tunnel layer are disposed over a surface of the substrate respectively. In addition, the doped region is disposed in the substrate under the inter-gate dielectric layer, and is used as a control gate. Moreover, the floating gate is disposed over the tunnel layer and the inter-gate dielectric layer. In addition, the first source region and the first drain region are disposed in the substrate beside two sides of the floating gate under the tunnel layer. Moreover, the high operational voltage component is disposed in the high operational voltage component area, and comprises a first inter-gate dielectric layer, a first gate, a second source region and a second drain region. The first inter-gate dielectric layer is disposed over a surface of the substrate of the high operational voltage component area. In addition, the first gate is disposed over the first inter-gate dielectric layer. Moreover, the second source region and the second drain region are disposed in the substrate at two sides of the first gate. In addition, the low operational voltage component is disposed in the low operational voltage component area, and comprises a second inter-gate dielectric layer, a second gate, a third source region and a third drain region. The second inter-gate dielectric layer is disposed over a surface of the substrate of the low operational voltage component area. Moreover, the second gate is disposed over the second inter-gate dielectric layer. In addition, the third source region and the third drain region are disposed in the substrate beside two sides of the second gate.

Accordingly, since the control gate of the EEPROM cell of the present invention is disposed in the substrate as a doped region, the structure of the EEPROM cell of the present invention is novel and different from the structure of the conventional memory cell having two polysilicon layers. In addition, the memory cell of the present invention can be integrated with the high operational voltage component and the low operational voltage component.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive

BRIEF DESCRIPTION OF THE DRAWINGS

The accompanying drawings are intended to provide further understanding of the invention, and are incorporated in and constitute a part of this specification. The drawings illustrate embodiments of the invention and, together with the description, serve to explain the principles of the invention.

DESCRIPTION OF THE EMBODIMENTS

The present invention is described in detail hereinafter with reference to the accompanying drawings, in which preferred embodiments of the invention are illustrated. The present invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

It is noted that, in the invention, the high operational voltage component represents a component operated under a relative high voltage, and the low operational voltage component represents a component operated under a relative low voltage. The relative high voltage and the relative low voltage are decided by the actual situation of the operation; however, the relative high voltage is larger that the relative low voltage.

FIG. 2A to FIG. 2D are cross-sectional views illustrating a manufacturing process of a memory device according to one embodiment of the present invention. The memory device comprises an EEPROM disposed in memory cell area and a high operational voltage component and a low operational voltage component disposed in peripheral circuit area. In addition, FIG. 3 is a schematic top view illustrating an EEPROM cell of a memory cell area of FIG. 2A to FIG. 2D. The cross-sectional view of the left side of the memory cell area 202 of FIG. 2A to FIG. 2D is along the cutting line I-I' of FIG. 3. The cross-sectional view of the right side of the memory cell area 202 of FIG. 2A to FIG. 2D is along the cutting line I-11' of FIG. 3.

Figure 1A:
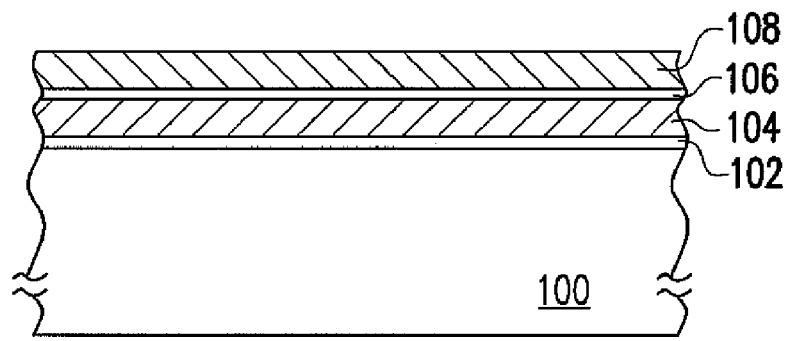
FIG. 1A and FIG. 1B are schematic cross-sectional views illustrating a manufacturing process of a conventional EEPROM.
Figure 1B:
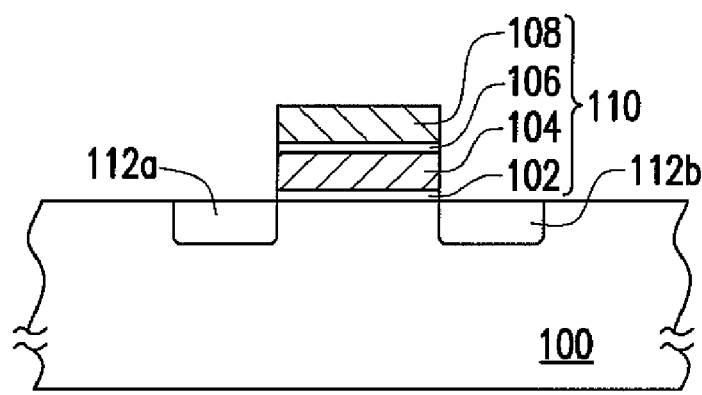
Figure 2A:
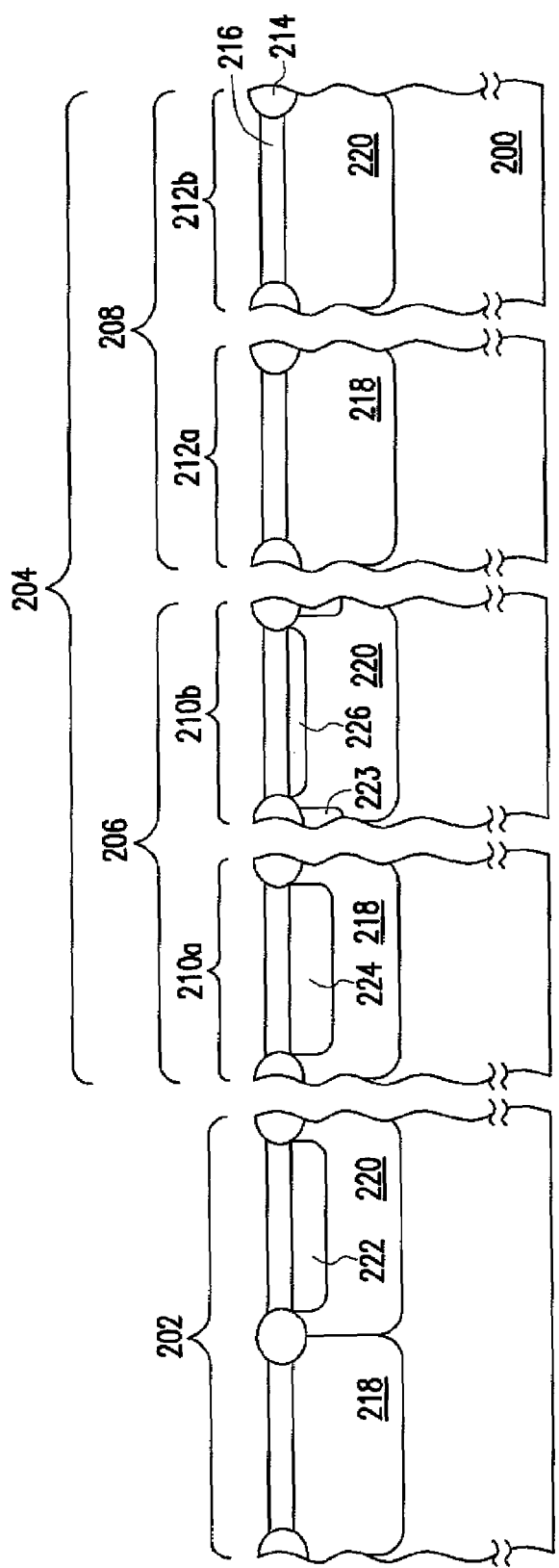
FIG. 2A to FIG. 2D are cross-sectional views illustrating a manufacturing process of a memory device according to one embodiment of the present invention.
Figure 3:
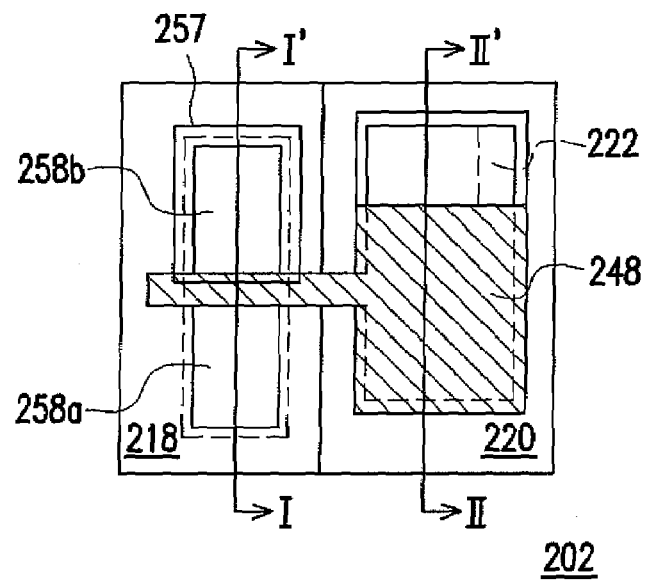
FIG. 3 is a schematic top view illustrating an EEPROM cell of a memory cell area of FIG. 2A to FIG. 2D, wherein the cross-sectional view of the left side of the memory cell area 202 of FIG. 2A to FIG. 2D is along the line I-I' of FIG. 3, and the cross-sectional view of the right side of the memory cell area 202 of FIG. 2A to FIG. 2D is along the line II-II' of FIG. 3.

Referring to FIG. 2A and FIG. 3, in the method of manufacturing the memory device of the present invention, for example, a substrate 200 having a memory cell area 202 and a peripheral circuit area 204 is provided first. The peripheral circuit area 204 comprises, for example but not limited to, a high operational voltage component area 206 and a low operational voltage component area 208.

In one embodiment of the present invention, the high operational voltage component area 206 further comprises, for example, an n-type high operational voltage component area 210a and a p-type high operational voltage component area 210b. The low operational voltage component area 208 further comprises, for example, an n-type low operational voltage component area 212a and a p-type low operational voltage component area 212b.

In addition, in one embodiment of the present invention, the areas described above are, for example but not limited to, defined by component isolation area 214. The component isolation area 214 is, for example but not limited to, formed by local oxidation (LOCOS) process, shallow trench isolation (STI) process or other applicable process.

Thereafter, a tunnel layer and an inter-gate dielectric layer are formed over the surface of the substrate 200 of the memory cell area 202 respectively. Two inter-gate dielectric layers are formed over the surface of the substrate 200 of the high operational voltage component area 206 and the low operational voltage component area 208 of the peripheral circuit area 204 respectively. A doped region is formed in the substrate 200 under the inter-gate dielectric layer and used as a control gate. In one embodiment of the present invention, the film layers and doped regions described above are formed by, for example but not limited to, the steps illustrated in FIG. 2A to FIG. 2C.

Referring to FIG. 2A, a dielectric material layer 216 is formed over the substrate 200. The material of the dielectric material layer 216 comprises, for example but not limited to, silicon oxide or other applicable material. The dielectric material layer 216 is, for example but not limited to, formed by thermal oxidation process or other applicable process. The thickness of the dielectric material layer 216 is, for example but not limited to, between about 30 nm to about 50 nm.

In one embodiment of the present invention, before the dielectric material layer 216 is formed, further comprises forming a p-type well region 218 and an n-type well region 220 in the substrate 200 of the memory cell area 202 and the peripheral circuit area 204. The well regions 218 and 220 are formed by, for example but not limited to, ion implant process. The p-type well region 218 of the peripheral circuit area 204 is formed in the substrate 200 of the n-type high operational voltage component area 210a and the n-type low operational voltage component area 212a. The n-type well region 220 is formed in the substrate 200 of the p-type high operational voltage component area 210b and the p-type low operational voltage component area 212b.

Thereafter, an n-type doped region 222 is formed in the well region 220 of the memory cell area 202 and used as a control gate. The n-type doped region 222 is formed by, for example but not limited to, ion implant process. In one embodiment of the present invention, during the n-type doped region 222 is formed, further comprises forming another n-type doped region 223 in the substrate 200 under the component isolation area 214 of the p-type high operational voltage component area 210b. The n-type doped region 223 may be, for example, used as a channel stop.

In addition, in one embodiment of the present invention, after the n-type doped region 222 is formed, the method further comprises forming a doped region 224 in the p-type well region 218 of the n-type high operational voltage component area 210a to adjust the dopant concentration of the predetermined channel area. Therefore, the threshold voltage of the high operational voltage component is adjusted. Moreover, in one embodiment of the present invention, after the n-type doped region 222 is formed, the method further comprises forming a doped region 226 in the n-type well region 220 of the p-type high operational voltage component area 210b to adjust the dopant concentration of the predetermined channel area. Therefore, the threshold voltage of the high operational voltage component is adjusted.

Figure 2B:
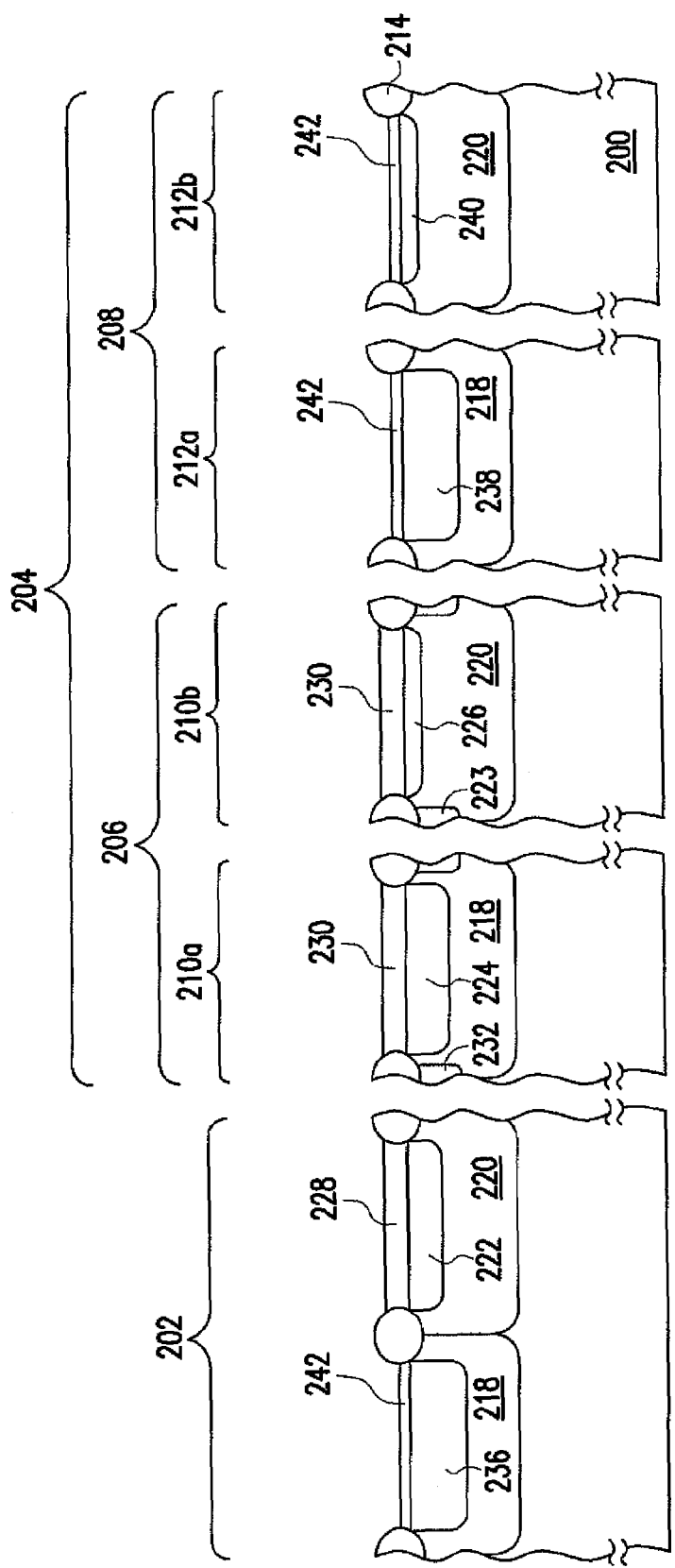

Then, referring to FIG. 2B, the dielectric material layer 216 over the p-type well region 218 in the memory cell area 202 is removed, and the dielectric material layer 216 over the surface of the substrate 200 of the low operational voltage component area 208 is removed. Therefore, a portion of the surface of the substrate 200 is exposed. The portion of the dielectric material layer 216 is removed by, for example but not limited to, dry etching process, wet etching process or other applicable process. A portion of the residual dielectric material layer 216 in the memory cell area 202 is used as an inter-gate dielectric layer 228, and a portion of the residual dielectric material layer 216 over the high operational voltage component area 206 is used as an inter-gate dielectric layer 230.

In one embodiment of the present invention, before a portion of the dielectric material layer 216 is removed, the method further comprises forming a doped region 232 as a channel stop in the substrate 200 under the component isolation area 214 of the n-type high operational voltage component area 210a. In addition, in one embodiment of the present invention, before a portion of the dielectric material layer 216 is removed, the method further comprises forming a doped region (not shown) as a channel stop and an anti-punch through junction surface in the n-type low operational voltage component area 212a and the memory cell area 202.

Moreover, in one embodiment of the present invention, before a portion of the dielectric material layer 216 is removed, the method further comprises forming a doped region 236 in the p-type well region 218 of the memory cell area 202, forming a doped region 238 in the p-type well region 218 of the n-type low operational voltage component area 212a of the peripheral circuit area 204, and forming a doped region 240 in the n-type well region 220 of the p-type low operational voltage component area 212b. Therefore, the dopant concentration of the predetermined channel area is adjusted, and the threshold voltage of the memory device and the low operational voltage component are adjusted.

Then, a dielectric material layer 242 is formed over the substrate 200. The material of the dielectric material layer 242 comprises, for example but not limited to, silicon oxide or other applicable material. The dielectric material layer 242 is formed by, for example but not limited to, thermal oxidation process or other applicable process. The thickness of the dielectric material layer 242 is, for example but not limited to, between about 6 nm to about 8 nm. In the meanwhile, the thickness of the inter-gate dielectric layer 230 and the inter-gate dielectric layer 228 is also increased.

Figure 2C:
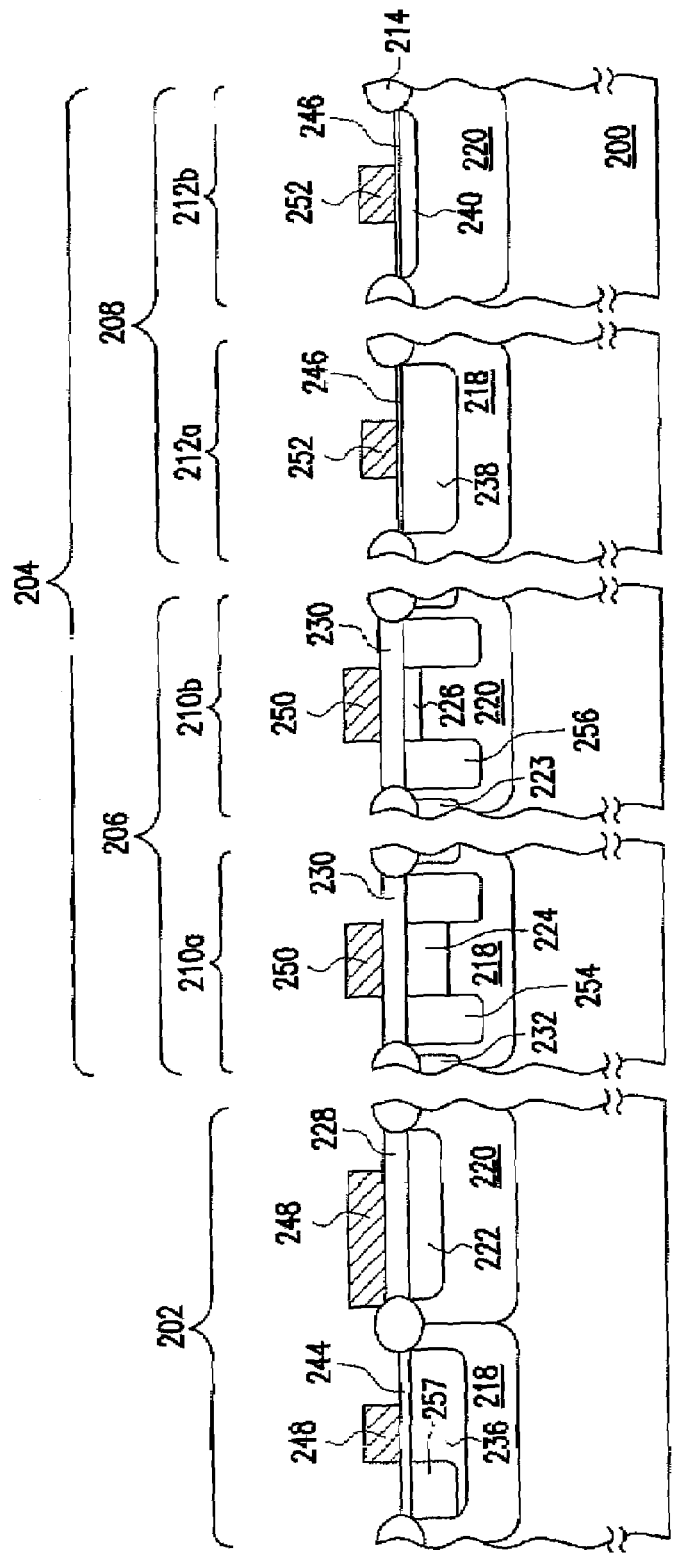

Then, referring to FIG. 2C, the dielectric material layer 242 of the low operational voltage component area 208 is removed to expose a portion of the surface of the substrate 200. The residual dielectric material layer 242 in the memory cell area 202 is used as a tunnel layer 244. A portion of the dielectric material layer 242 is removed by, for example but not limited to, dry etching process, wet etching process or other applicable process.

Thereafter, a dielectric material layer (not shown) is formed over the substrate 200, wherein a portion of the dielectric material layer formed in the low operational voltage component area 208 is used as an inter-gate dielectric layer 246. The material of the dielectric material layer comprises, for example but not limited to, silicon oxide or other applicable material. The dielectric material layer is formed by, for example but not limited to, thermal oxidation process or other applicable process. The thickness of the dielectric material layer is, for example but not limited to, between about 6 nm to about 7 nm. At this moment, the thicknesses of the inter-gate dielectric layer 230, the inter-gate dielectric layer 228 and the tunnel layer 244 are also increased. In one embodiment of the present invention, the thickness of the inter-gate dielectric layer 228 of the memory cell area 202 is greater than the thickness of the tunnel layer 244. The thickness of the inter-gate dielectric layer 228 is, for example but not limited to, between about 30 nm to about 50 nm. The thickness of the tunnel layer 244 is, for example but not limited to, between about 9.5 nm to about 10 nm. In addition, the thickness of the inter-gate dielectric layer 230 of the high operational voltage component area 206 is, for example but not limited to, larger than the thickness of the inter-gate dielectric layer 246 of the low operational voltage component area 208. Therefore, the component formed in the high operational voltage component area 206 may be applied with higher voltage. The thickness of the inter-gate dielectric layer 230 is, for example but not limited to, between about 45 nm to about 50 nm. The thickness of the inter-gate dielectric layer 246 is, for example but not limited to, between about 6 nm to about 7 nm.

Then, a floating gate 248 is formed over the inter-gate dielectric layer 228 and the tunnel layer 244 of the memory cell area 202, and gates 250 and 252 are formed over the inter-gate dielectric layer 230 and the inter-gate dielectric layer 246 of the peripheral circuit area 204 respectively. The material of the floating gate 248 and gates 250 and 252 comprises, for example but not limited to, polysilicon, doped polysilicon, metal silicide or other applicable conductive material. The metal silicide comprises, for example but not limited to, tungsten silicide. In addition, the floating gate 248 and gates 250 and 252 are formed by, for example but not limited to, conventional manufacturing process of gate.

In one embodiment of the present invention, after the floating gate 248 and gates 250 and 252 are formed, the method further comprises forming an n-type deeply doped region 254 and a p-type deeply doped region 256 in the substrate 200 at two sides of the gate 250 of the n-type high operational voltage component area 210a and the p-type high operational voltage component area 210b respectively. Therefore, the breakdown voltage of the high operational voltage component is increased.

In addition, in one embodiment of the present invention, after the floating gate 248 and the gates 250 and 252 are formed, the method further comprises forming an n-type deeply doped region 257 in the doped region 236 memory cell area 202 of the p-type well region 218 under the tunnel layer 244. Therefore, the breakdown voltage at the source terminal of the memory device is increased.

Figure 2D:
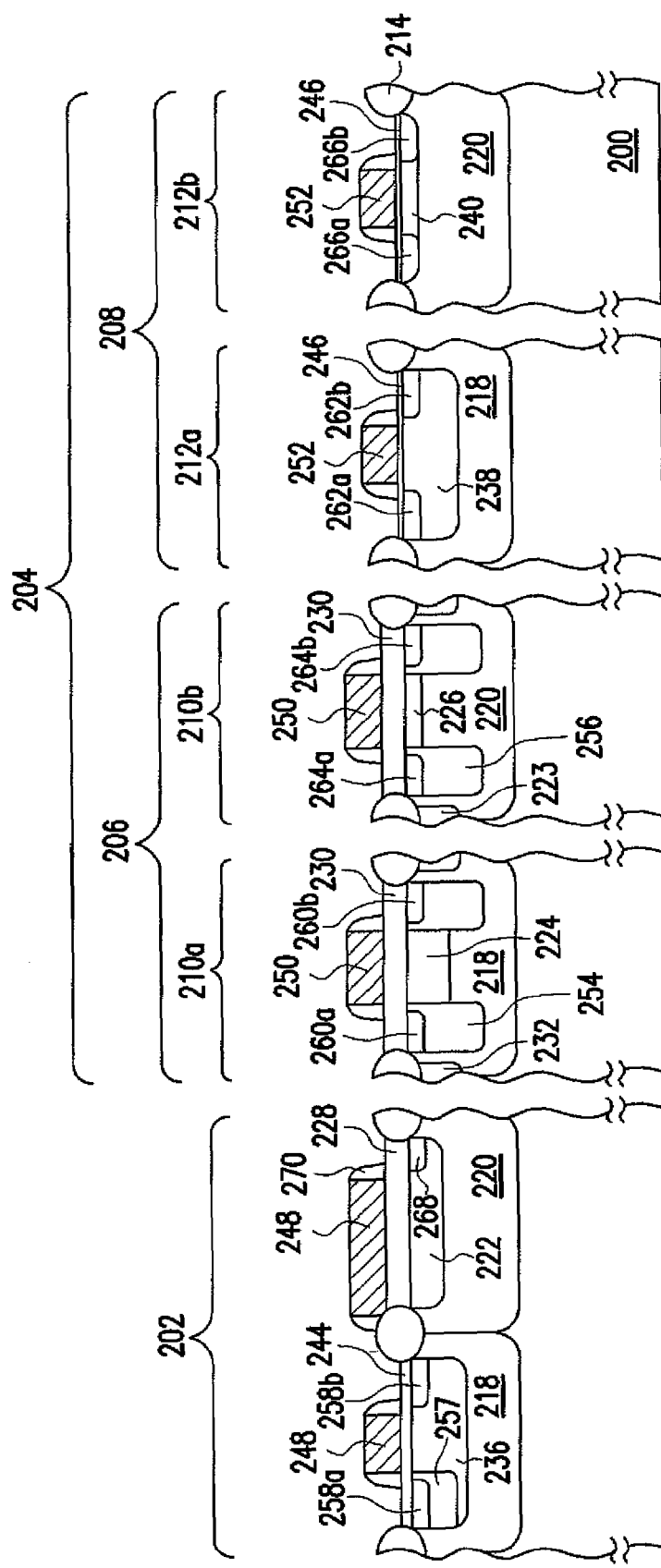

Then, referring to FIG. 2D, an n-type source region 258a and a drain region 258b are formed in the substrate 200 beside two sides of the floating gate 248 under the tunnel layer 244 in the memory cell area 202. An n-type source region 260a and a drain region 260b are formed in the deeply doped region 254 beside two sides of the gate 250 in the n-type high operational voltage component area 210a. An n-type source region 262a and a drain region 262b are formed in the doped region 238 beside two sides of the gate 252 in the n-type low operational voltage component area 212a. A p-type source region 264a and a drain region 264b are formed in the deeply doped region 256 beside two sides of the gate 250 in the p-type high operational voltage component area 210b. A p-type source region 266a and a drain region 266b are formed in the doped region 240 beside two sides of the gate 252 in the p-type low operational voltage component area 212b. The source region and the drain region described above are formed by, for example but not limited to, ion implant process using p-type dopant and/or n-type dopant.

In one embodiment of the present invention, during the n-type source region and drain region are formed, the method further comprises forming an n-type densely doped region 268 in the doped region 222 beside the floating gate 248 of the memory cell area 202. The n-type densely doped region 268 may be used as a portion of the control gate to increase the conductivity of the control gate.

In addition, in one embodiment of the present invention, before or after the source region and the drain region are formed, the method further comprises forming a lightly doped drain region (not shown) in the substrate 200 beside two sides of the floating gate 248 and the gates 250 and 252. Therefore, the dopant concentration of the source region and the drain region can be adjusted. The lightly doped drain region is formed by, for example but not limited to, pocket type ion implant process or conventional ion implant process using the spacer 270 formed on the sidewall of the floating gate 248 and the gates 250 and 252 as mask.

After the source region and the drain region described above are formed, the method further comprises performing an annealing process to the source region and the drain region, and then performing a related interconnection process. Since those skilled in the art are acquainted with the interconnection process, it will not be described in detail.

Hereinafter, the structure formed in the method of the present invention described above will be described. Referring to FIG. 2D and FIG. 3, the memory device of the present invention comprises, for example but not limited to, a substrate 200, at least a memory cell, at least a high operational voltage component and at least a low operational voltage component. The substrate 200 comprises a memory cell area 202 and a peripheral circuit area 204, the peripheral circuit area 204 comprises a high operational voltage component area 206 and a low operational voltage component area 208, wherein these areas are mutually separated by component isolation area 214.

In one embodiment of the present invention, the high operational voltage component area 206 further comprises an n-type high operational voltage component area 210a and a p-type high operational voltage component area 210b. The low operational voltage component area 208 further comprises an n-type low operational voltage component area 212a and a p-type low operational voltage component area 212b. In addition, in one embodiment of the present invention, the substrate 200 further comprises a plurality of p-type well regions 218 and a plurality of n-type well regions 220. The p-type well region 218 in the peripheral circuit area 204 is disposed in the substrate 200 of the n-type high operational voltage component area 210a and the n-type low operational voltage component area 212a. The n-type well region 220 in the peripheral circuit area 204 is disposed in the substrate 200 of the p-type high operational voltage component area 210b and the n-type low operational voltage component area 212b.

Moreover, the memory cell is disposed in the memory cell area 202 and comprises an inter-gate dielectric layer 228, a tunnel layer 244, a doped region 222, a floating gate 248, a source region 258a and a drain region 258b. The inter-gate dielectric layer 228 and the tunnel layer 244 are respectively disposed over the surface of the substrate 200 of the memory cell area 202. The thickness of the inter-gate dielectric layer 228 is greater than the thickness of the tunnel layer 244, and is, for example but not limited to, between about 30 nm to about 50 nm. The thickness of the tunnel layer 244 is, for example but not limited to, between about 9.5 nm to about 10 nm.

In addition, the doped region 222 is disposed in the n-type well region 220 under the inter-gate dielectric layer 228, and is used as a control gate. The dopant of the doped region 222 comprises, for example but not limited to, an n-type dopant.

Moreover, the floating gate 248 is disposed over the tunnel layer 244 and the inter-gate dielectric layer 228. The source region 258a and the drain region 258b are disposed in the substrate 200 beside two sides of the floating gate 248 over the tunnel layer 244.

In one embodiment of the present invention, the memory cell further comprises a densely doped region 268 disposed in the doped region 222 beside the floating gate 248 of the memory cell area 202. The densely doped region 268 may be a portion of the control gate to increase the conductivity of the control gate. In addition, in one embodiment of the present invention, the memory cell further comprises a doped region 236 disposed in the p-type well region 218, wherein the source region 258a and the drain region 258b are disposed in the doped region 236. Therefore, the dopant concentration of the channel area may be adjusted, and further the threshold voltage of the memory device may also be adjusted. Moreover, in one embodiment of the present invention, the memory cell further comprises a deeply doped region 257 disposed in the doped region 236 under the tunnel layer 244. The source region 258a is disposed in the deeply doped region 257 to increase the breakdown voltage at the source terminal of the memory device.

Moreover, the high operational voltage component is disposed in the high operational voltage component area 206 and comprises an inter-gate dielectric layer 230, a gate 250, source regions 260a and 264a and drain regions 260b and 264b. The inter-gate dielectric layer 230 is disposed over the surface of the substrate 200 of the high operational voltage component area 206. The gate 250 is disposed over the inter-gate dielectric layer 230.

In addition, the source region 260a and the drain region 260b are disposed in the substrate 200 beside two sides of the gate 250 of the n-type high operational voltage component area 210a. The dopant of the source region 260a and the drain region 260b comprises n-type dopant. Moreover, the source region 264a and the drain region 264b are disposed in the substrate 200 at two sides of the gate 250 of the p-type high operational voltage component area 210b. The dopant of the source region 264a and the drain region 264b comprises p-type dopant.

In one embodiment of the present invention, the high operational voltage component further comprises doped regions 224 and 226 disposed in the p-type well region 218 and the n-type well region 220 respectively. The source region 260a, the drain region 260b, the source region 264a and the drain region 264b may be disposed in the doped regions 224 and 226 respectively to adjust the dopant concentration of the channel area. Therefore, the threshold voltage of the high operational voltage component is adjusted. Moreover, the high operational voltage component further comprises deeply doped regions 254 and 256 disposed in the p-type well region 218 and the n-type well region 220 beside two sides of the gate 250 respectively. The source region 260a, the drain region 260b, the source region 264a and the drain region 264b may be disposed in the deeply doped regions 254 and 256 respectively to increase the breakdown voltage of the high operational voltage component. Moreover, the high operational voltage component further comprises doped regions 232 and 223, disposed in the substrate 200 under the component isolation area 214 of the p-type well region 218 and the n-type well region respectively, and is used as a channel stop.

Moreover, the low operational voltage component is disposed in the low operational voltage component area 208, and comprises an inter-gate dielectric layer 246, a gate 252, source regions 262a and 266a and drain regions 262b and 266b. The inter-gate dielectric layer 246 is disposed over the surface of the substrate 200 of the low operational voltage component area 208. In addition, the thickness of the inter-gate dielectric layer 230 of the high operational voltage component area 206 is greater than the thickness of the inter-gate dielectric layer 246 of the low operational voltage component 208. Therefore, the component formed in the high operational voltage component area 206 may be applied with higher voltage. The thickness of the inter-gate dielectric layer 230 is, for example but not limited to, between about 45 nm to about 50 nm. The thickness of the inter-gate dielectric layer 246 is, for example but not limited to, between about 6 nm to about 7 nm.

In addition, the gate 252 is disposed over the inter-gate dielectric layer 246. Moreover, the source region 262a and the drain region 262b are disposed in the substrate 200 beside two sides of the gate 252 of the n-type low operational voltage component area 212a. The dopant of the source region 262a and the drain region 262b comprises an n-type dopant. In addition, the source region 266a and the drain region 266b are disposed in the substrate 200 beside two sides of the gate 252 of the p-type low operational voltage component area 212b. The dopant of the source region 266a and the drain region 266b comprises a p-type dopant.

In one embodiment of the present invention, the low operational voltage component further comprises doped regions 238 and 240 disposed in the p-type well region 218 and the n-type well region 220 respectively. The source region 262a, the drain region 262b, the source region 266a and drain region 266b are disposed in the doped regions 238 and 240 respectively to adjust the dopant concentration of the channel area. Therefore, the threshold voltage of the low operational voltage component is adjusted.

Figure 4:
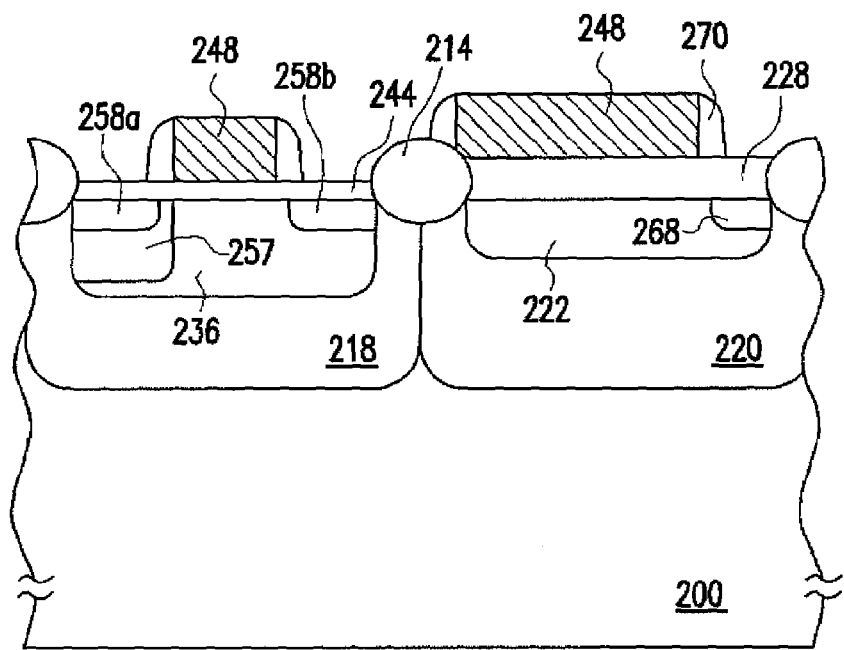
FIG. 4 is a cross-sectional view of an EEPROM cell according to one embodiment of the present invention.

It is noted that, the method and the device of the present invention is not limited to the embodiments of the present invention described above. For example, the EEPROM cell (e.g., as shown in FIG. 4) of the memory device may be integrated with another kind of circuits or components except for the high operational voltage component or the low operational voltage component of the peripheral circuit area described above.

Therefore, the method of forming an EEPROM cell of the present invention comprises, for example but not limited to, the following steps. First, a tunnel layer 244 and an inter-gate dielectric layer 228 are formed over the surface of the substrate 200 respectively. Then, a doped region 222 is formed in the substrate 200 under the inter-gate dielectric layer 228 and used as a control gate. Thereafter, a floating gate 248 is formed over the inter-gate dielectric layer 228 and the tunnel layer 244. A source region 258a and a drain region 258b are further formed in the substrate 200 beside two sides of the floating gate 248 under the tunnel layer 244. Therefore, the EEPROM cell formed by the method above comprises a substrate 200, an inter-gate dielectric layer 228, a tunnel layer 244, a doped region 222, a floating gate 248, a source region 258a and a drain region 258b. The inter-gate dielectric layer 228 and the tunnel layer 244 are disposed over a surface of the substrate 200 respectively. In addition, the doped region 222 is disposed in the substrate 200 under the inter-gate dielectric layer 228, and used as a control gate. Moreover, the floating gate 248 is disposed over the tunnel layer 244 and the inter-gate dielectric layer 228. In addition, the source region 258a and the drain region 258b are disposed in the substrate 200 at two sides of the floating gate 248 under the tunnel layer 244.

Accordingly, the present invention has the advantages described below. First, the structure of the memory cell of the present invention is novel since the EEPROM cell of the present invention is formed in the n-type well region and the p-type well region, and the control gate is formed in the substrate as a doped region. Furthermore, in the EEPROM cell of the present invention, only the floating gate is formed over the substrate. The control gate formed in the substrate as a doped region. Therefore, the integration of the EEPROM cell of the present invention with the component having a single gate in the general peripheral circuit area is easy. In addition, in the EEPROM cell of the present invention, the inter-gate dielectric layer is much thicker, and the source region is formed in the deeply doped region. Therefore, the EEPROM cell of the present invention may integrate with the high operational voltage component and the low operational voltage component. In other words, the EEPROM cell of the present invention may operate between, for example but not limited to, about 10V to about 20V and thus may integrate with the high operational voltage component. In addition, the EEPROM cell of the present invention may also operate between, for example but not limited to, about 3V to about 6V, and thus may integrate with the low operational voltage component.

It will be apparent to those skilled in the art that various modifications and variations can be made to the structure of the present invention without changing the scope or departing from the spirit of the present invention. In view of the foregoing, it is intended that the present invention cover modifications and variations of this invention provided they fall within the scope of the following claims and their equivalents.

What is claimed is:

1. A manufacturing method of a memory device, comprising:
    providing a substrate comprising a memory cell area and a peripheral circuit area, wherein the peripheral circuit area comprises a high operational voltage component area and a low operational voltage component area;
    forming a tunnel layer and an inter-gate dielectric layer over a surface of the substrate in the memory cell area respectively, and forming a first inter-gate dielectric layer and a second inter-gate dielectric layer on a surface of the substrate of the high operational voltage component area and the low operational voltage component area of the peripheral circuit area respectively;
    forming a doped region used as a control gate in the substrate under the inter-gate dielectric layer;
    forming a floating gate over the inter-gate dielectric layer and the tunnel layer of the memory cell area, and forming a first gate and a second gate over the first inter-gate dielectric layer and the second inter-gate dielectric layer of the peripheral circuit area respectively; and
    forming a first source region and a first drain region in the substrate on two sides of the floating gate under the tunnel layer of the memory cell area, and forming a second source region and a second drain region in the substrate on two sides of the first gate of the peripheral circuit area, and forming a third source region and a third drain region in the substrate on two sides of the second gate of the peripheral circuit area.

2. The method of claim 1, wherein a thickness of the inter-gate dielectric layer is greater than a thickness of the tunnel layer.

3. The method of claim 1, wherein a thickness of the first inter-gate dielectric layer is greater than a thickness of the second inter-gate dielectric layer.

4. The method of claim 1, wherein the substrate comprises a first well region and a second well region, and the tunnel layer is formed on a surface of the first well region, and the inter-gate dielectric layer is formed on a surface of the second well region, and the doped region used as the control gate is formed in the second well region.

5. The method of claim 1, wherein the method of forming the tunnel layer and the inter-gate dielectric layer of the memory cell area, and the method of forming the first inter-gate dielectric layer and the second inter-gate dielectric layer of the peripheral circuit area comprises:
    forming a first dielectric material layer over the substrate;
    removing a portion of the first dielectric material layer disposed over the memory cell area, and removing the first dielectric material layer disposed over the low operational voltage component area to form an exposed surface of the substrate;
    forming a second dielectric material layer over the substrate;
    removing the second dielectric material layer disposed over the low operational voltage component area to form another exposed surface of the substrate; and
    forming a third dielectric material layer, wherein the tunnel layer of the memory cell area comprises the second dielectric material layer and the third dielectric material layer, the inter-gate dielectric layer of the memory cell area and the first inter-gate dielectric layer of the peripheral circuit area comprises the first dielectric material layer, the second dielectric material layer and the third dielectric material layer, and the second inter-gate dielectric layer of the peripheral circuit area comprises the third dielectric material layer.

6. The method of claim 1, wherein the method of forming the first source region and the first drain region comprises:
    forming a deeply doped region in the substrate corresponding to one side of the floating gate and under the tunnel layer; and
    forming the source region and the drain region in the substrate at two sides of the floating gate and under the tunnel layer, wherein the first source region is formed in the deeply doped region.

7. The method of claim 1, wherein the method of forming the second source region and the second drain region comprises:
    forming two deeply doped regions in the substrate corresponding to two sides of the first gate and under the first inter-gate dielectric layer of the peripheral circuit area respectively; and
    forming the second source region and the second drain region in the substrate corresponding to the two sides of the first gate and under the first inter-gate dielectric layer of the peripheral circuit area respectively, wherein the second source region and the second drain region are formed in the deeply doped regions.

* * * * *